(12) United States Patent
Hsieh et al.

(10) Patent No.: US 8,759,219 B2
(45) Date of Patent: Jun. 24, 2014

(54) PLANARIZATION METHOD APPLIED IN PROCESS OF MANUFACTURING SEMICONDUCTOR COMPONENT

(75) Inventors: Ya-Hsueh Hsieh, Kaohsiung (TW); Teng-Chun Tsai, Tainan (TW); Wen-Chin Lin, Tainan County (TW); Hsin-Kuo Hsu, Kaohsiung County (TW); Ren-Peng Huang, Changhua County (TW); Chih-Hsien Chen, Miaoli County (TW); Chih-Chin Yang, Tainan County (TW); Hung-Yuan Lu, Kaohsiung (TW); Jen-Chieh Lin, Kaohsiung (TW); Wei-Che Tsao, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 715 days.

(21) Appl. No.: 13/012,211

(22) Filed: Jan. 24, 2011

(65) Prior Publication Data

US 2012/0187563 A1     Jul. 26, 2012

(51) Int. Cl.
*H01L 21/331* (2006.01)
*H01L 21/463* (2006.01)

(52) U.S. Cl.
USPC ........... 438/693; 257/751; 438/689; 438/734; 438/750

(58) Field of Classification Search
USPC .................. 438/259, 278, 589, 690–693, 734, 438/749–751
See application file for complete search history.

(56) References Cited

U.S. PATENT DOCUMENTS

| 6,423,619 | B1* | 7/2002 | Grant et al. ................... 438/589 |
| 6,440,808 | B1* | 8/2002 | Boyd et al. .................... 438/305 |
| 2003/0166338 | A1 | 9/2003 | Ahn et al. |
| 2010/0059823 | A1* | 3/2010 | Chung et al. .................. 257/355 |
| 2012/0094488 | A1* | 4/2012 | Neo et al. ...................... 438/692 |
| 2014/0017893 | A1* | 1/2014 | Minami et al. ................ 438/693 |

FOREIGN PATENT DOCUMENTS

TW         I251345         3/2006
WO    WO 2009054370 A1 *   4/2009

* cited by examiner

*Primary Examiner* — Ha Tran T Nguyen
*Assistant Examiner* — Raj R Gupta
(74) *Attorney, Agent, or Firm* — WPAT, PC; Justin King

(57) ABSTRACT

A planarization method of manufacturing a semiconductor component is provided. A dielectric layer is formed above a substrate and defines a trench therein. A barrier layer and a metal layer are formed in sequence in the trench. A first planarization process is applied to the metal layer by using a first reactant so that a portion of the metal layer is removed. An etching rate of the first reactant to the metal layer is greater than that of the first reactant to the barrier layer. A second planarization process is applied to the barrier layer and the metal layer by using a second reactant so that a portion of the barrier layer and the metal layer are removed to expose the dielectric layer. An etching rate of the second reactant to the barrier layer is greater than that of the second reactant to the metal layer.

22 Claims, 2 Drawing Sheets

PLANARIZATION METHOD APPLIED IN PROCESS OF MANUFACTURING SEMICONDUCTOR COMPONENT

FIELD OF THE INVENTION

The present invention relates to a planarization method, and particularly to a planarization method applied in a process of manufacturing a semiconductor device.

BACKGROUND OF THE INVENTION

With the development of semiconductor industry, sizes of semiconductor components have been in nanometers. Thus, a gate dielectric layer of a metal oxide semiconductor (MOS) transistor becomes thinner and thinner with the decrease of a size of a channel. However, if a thickness of the gate dielectric layer is too thin, a current leakage will generated badly, thereby affecting the performance of the MOS transistor and increasing power energy consumption. Therefore, currently, a gate structure including an insulating layer with high dielectric constant (high-K) has been widely used. Such gate structure can reduce a current leakage, thereby improving the performance of the MOS transistor. Additionally, the insulating layer with high dielectric constant is generally cooperated with a metal gate so as to reduce a resistance of the gate structure. In order to improve the thermal stability of the gate structure and to prevent a reaction of the metal gate and the insulating layer with high dielectric constant, a barrier layer is generally disposed between the metal gate and the insulating layer with high dielectric constant. For example, the barrier layer can be made of titanium nitride (TiN). However, during manufacturing the gate structure with the barrier layer, the non-planarity of a surface of the gate structure will occur, thereby affecting the quality of the MOS transistor.

Therefore, what is needed is to a planarization method applied in a process of manufacturing a semiconductor component to overcome the above disadvantages.

SUMMARY OF THE INVENTION

The present invention is directed to a planarization method applied in a process of manufacturing a semiconductor component so as to obtain a surface with good flatness.

The present invention provides a planarization method applied in a process of manufacturing a semiconductor component. The planarization method includes the following steps. A substrate is provided. A dielectric layer is formed above the substrate. The dielectric layer defines a trench therein. A barrier layer and a metal layer are formed on the dielectric layer in sequence and filled in the trench. A first planarization process is applied to the metal layer by using a first reactant so that a portion of the metal layer is removed to expose a portion of the barrier layer. An etching rate of the first reactant to the metal layer is greater than an etching rate of the first reactant to the barrier layer. A second planarization process is applied to the barrier layer and the metal layer by using a second reactant so that a portion of the barrier layer and a portion of the metal layer are removed to expose the dielectric layer. An etching rate of the second reactant to the barrier layer is greater than an etching rate of the second reactant to the metal layer.

In one embodiment of the present invention, the planarization method further includes forming a gate dielectric layer below the dielectric layer.

In one embodiment of the present invention, the planarization method further includes forming a gate dielectric layer in the trench before forming the barrier layer.

In one embodiment of the present invention, the gate dielectric layer is a high-K dielectric layer, the barrier layer is a gate barrier layer, and the metal layer is a gate metal layer.

In one embodiment of the present invention, the high-K dielectric layer is either a single layer structure selected from a group consisting of a hafnium oxide ($HfO_2$) layer, a hafnium silicon oxynitride (HfSiON) layer and a hafnium silicon oxide (HfSiO) layer or a multilayer structure comprised of at least two of the hafnium oxide layer, the hafnium silicon oxynitride layer and the hafnium silicon oxide layer.

In one embodiment of the present invention, the barrier layer is either a single layer structure selected from a group consisting of a titanium nitride (TiN) layer, a tantalum carbide (TaC) layer, a tungsten carbide (WC) layer, a titanium carbide (TiC) layer, a tantalum nitride (TaN) layer and a titanium aluminum nitride (TiAlN) layer or a multilayer structure comprised of at least two of the titanium nitride layer, the tantalum carbide layer, the tungsten carbide layer, the titanium carbide layer, the tantalum nitride layer and the titanium aluminum nitride layer.

In one embodiment of the present invention, the metal layer is either a single layer structure selected from a group consisting of a titanium nitride (TiN) layer, a tungsten (W) layer, an aluminum (Al) layer, a titanium (Ti) layer, a tantalum (Ta) layer, a tantalum nitride (TaN) layer, a cobalt (Co) layer, a copper (Cu) layer and a nickel (Ni) layer or a multilayer structure comprised of at least two of the titanium nitride layer, the tungsten layer, the aluminum layer, the titanium layer, the tantalum layer, the tantalum nitride layer, the cobalt layer, the copper layer and the nickel layer.

In one embodiment of the present invention, the first planarization process is a first chemical mechanical polishing (CMP) process, and the second planarization process is a second chemical mechanical polishing (CMP) process. The first reactant is a first chemical mechanical polishing slurry, and the second reactant is a second chemical mechanical polishing slurry. The first chemical mechanical polishing process and the second chemical mechanical polishing process are performed either on single-pad chemical mechanical polishing apparatus or on a multi-pad chemical mechanical polishing apparatus capable of supplying the first chemical mechanical polishing slurry and the second chemical mechanical polishing slurry. Each of the first chemical mechanical polishing slurry and the second chemical mechanical polishing slurry further includes an adhesive material selected from a group consisting of silicon, cerium dioxide ($CeO_2$) and aluminum oxide ($Al_2O_3$).

In one embodiment of the present invention, each of the first chemical mechanical polishing slurry and the second chemical mechanical polishing slurry includes an oxidizer, and a concentration of the oxidizer of the first chemical mechanical polishing slurry is less than a concentration of the oxidizer of the second chemical mechanical polishing slurry.

In one embodiment of the present invention, the oxidizer is a hydrogen peroxide.

In one embodiment of the present invention, a concentration of the hydrogen peroxide of the first chemical mechanical polishing slurry is in a range from 0% to 1%, and a concentration of the hydrogen peroxide of the second chemical mechanical polishing slurry is greater than 1%.

The present invention also provides a planarization method applied in a process of manufacturing a semiconductor component. The planarization method includes the following steps. A substrate is provided. A gate structure including a dielectric layer and a dummy poly-silicon gate disposed in the dielectric layer is formed on the substrate. The dummy poly-silicon gate is removed to form a trench in the dielectric layer. A gate barrier layer is formed on the dielectric layer and in the trench. A gate metal layer is formed on the gate barrier layer and filled into the trench. A first planarization process is applied to the gate metal layer by using a first reactant so that a portion of the gate metal layer is removed to expose a portion of the gate barrier layer. An etching rate of the first reactant to the gate metal layer is greater than an etching rate of the first reactant to the gate barrier layer. A second planarization process is applied to the gate barrier layer and the gate metal layer by using a second reactant so that a portion of the gate barrier layer and a portion of the gate metal layer are removed to expose the dielectric layer. An etching rate of the second reactant to the gate barrier layer is greater than an etching rate of the second reactant to the gate metal layer.

In one embodiment of the present invention, the planarization method further includes forming a gate dielectric layer below the dielectric layer.

In one embodiment of the present invention, the planarization method further includes forming a gate dielectric layer in the trench before forming the barrier layer.

In one embodiment of the present invention, before the first planarization process, the planarization method further includes applying a third planarization process to the gate metal layer by using a third reactant so that the gate metal layer is thinned to a predetermined thickness. An etching rate of the third reactant to the gate metal layer is greater than the etching rate of the first reactant to the gate metal layer.

In one embodiment of the present invention, the predetermined thickness is greater than 100 angstroms.

In one embodiment of the present invention, the gate dielectric layer is a high-K dielectric layer. The high-K dielectric layer is either a single layer structure selected from a group consisting of a hafnium oxide ($HfO_2$) layer, a hafnium silicon oxynitride (HfSiON) layer and a hafnium silicon oxide (HfSiO) layer or a multilayer structure comprised of at least two of the hafnium oxide layer, the hafnium silicon oxynitride layer and the hafnium silicon oxide layer.

In one embodiment of the present invention, the gate barrier layer is either a single layer structure selected from a group consisting of a titanium nitride (TiN) layer, a tantalum carbide (TaC) layer, a tungsten carbide (WC) layer, a titanium carbide (TiC) layer, a tantalum nitride (TaN) layer and a titanium aluminum nitride (TiAlN) layer or a multilayer structure comprised of at least two of the titanium nitride layer, the tantalum carbide layer, the tungsten carbide layer, the titanium carbide layer, the tantalum nitride layer and the titanium aluminum nitride layer.

In one embodiment of the present invention, the gate metal layer is either a single layer structure selected from a group consisting of a titanium nitride (TiN) layer, a tungsten (W) layer, an aluminum (Al) layer, a titanium (Ti) layer, a tantalum (Ta) layer, a tantalum nitride (TaN) layer, a cobalt (Co) layer, a copper (Cu) layer and a nickel (Ni) layer or a multilayer structure comprised of at least two of the titanium nitride layer, the tungsten layer, the aluminum layer, the titanium layer, the tantalum layer, the tantalum nitride layer, the cobalt layer, the copper layer and the nickel layer.

In one embodiment of the present invention, the first planarization process is a first chemical mechanical polishing process, and the second planarization process is a second chemical mechanical polishing process. The first reactant is a first chemical mechanical polishing slurry, and the second reactant is a second chemical mechanical polishing slurry. The first chemical mechanical polishing process and the second chemical mechanical polishing process are performed either on single-pad chemical mechanical polishing apparatus or on a multi-pad chemical mechanical polishing apparatus capable of supplying the first chemical mechanical polishing slurry and the second chemical mechanical polishing slurry. Each of the first chemical mechanical polishing slurry and the second chemical mechanical polishing slurry further includes an adhesive material selected from a group consisting of silicon, cerium dioxide ($CeO_2$) and aluminum oxide ($Al_2O_3$).

In one embodiment of the present invention, an etching selectivity ratio of the first chemical mechanical polishing slurry to the gate metal layer and the gate barrier layer is more than 20, and an etching selectivity ratio of the second chemical mechanical polishing slurry to the gate metal layer and the gate barrier layer is more than 20.

In one embodiment of the present invention, each of the first chemical mechanical polishing slurry and the second chemical mechanical polishing slurry includes an oxidizer, and a concentration of the oxidizer of the first chemical mechanical polishing slurry is less than a concentration of the oxidizer of the second chemical mechanical polishing slurry.

In one embodiment of the present invention, the oxidizer is a hydrogen peroxide.

In one embodiment of the present invention, a concentration of the hydrogen peroxide of the first chemical mechanical polishing slurry is in a range from 0% to 1%, and a concentration of the hydrogen peroxide of the second chemical mechanical polishing slurry is greater than 1%.

The present invention also provides a gate structure. The gate structure includes a substrate, a dielectric layer, a gate barrier layer and a gate metal layer. The dielectric layer is disposed above the substrate and defines at least a trench therein. The gate barrier layer is disposed in the trench. The gate metal layer is disposed on a surface of the barrier layer so that the trench is filled with the gate metal layer. A top surface of the gate metal layer is lower than a top surface of the dielectric layer on two sides of the trench, and a height difference of the top surface of the gate metal layer and the top surface of the dielectric layer is less than 50 angstroms.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
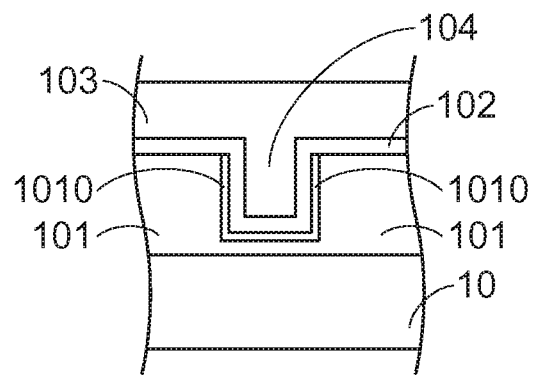
FIGS. 1A-1C illustrate a process flow of a planarization method in accordance with an embodiment of the present invention.
Figure 1B:
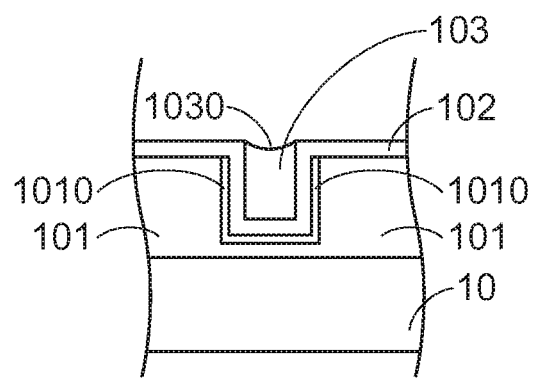
Figure 1C:
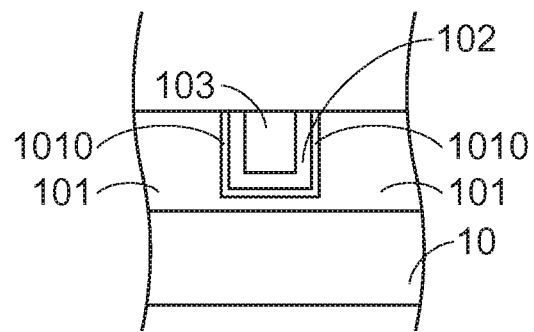
Figure 2A:
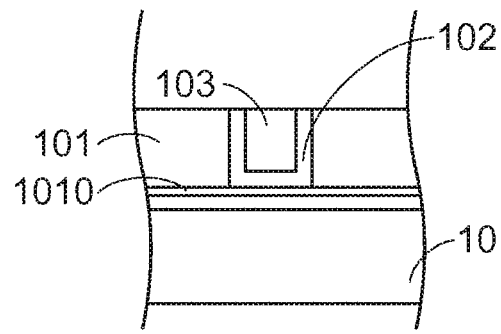
FIGS. 2A-2B illustrate schematic views of two gate structures.

FIGS. 1A-1C illustrate a process flow of a planarization method in accordance with an embodiment of the present invention. The planarization method can be widely applied in a process of manufacturing a semiconductor component such as a metal oxide semiconductor (MOS) transistor. At first, referring to FIG. 1A, a substrate 10, for example, a silicon substrate, is provided. Next, a high-K/metal gate (HK/MG) process is performed to form a gate structure. During the high-K/metal gate process, a dielectric layer 101 is formed above the substrate 10. The dielectric layer 101 defines at least a trench 104 therein. A gate dielectric layer 1010, a barrier layer 102 and a metal layer 103 are formed in sequence in the trench 104 to constitute the gate structure. The trench 104 can be formed by removing a dummy poly-silicon gate (not shown) in the dielectric layer 101. The gate dielectric layer 1010 of the gate structure can be formed after the trench 104 is formed, as shown in FIG. 1A. It is noted that, before forming the trench 104, the gate dielectric layer 1010 is formed above the substrate 10 and below the dielectric layer 101, as shown in FIG. 2A. The gate dielectric layer 1010 can be a high-K dielectric layer. The barrier layer 102 can be a gate barrier layer of the gate structure. The metal layer 103 can be a gate metal layer of the gate structure.

Next, referring to FIG. 1B, a first planarization process is applied to the metal layer 103 by using a first reactant so that a portion of the metal layer 103 is removed to expose a portion of the barrier layer 102. An etching rate of the first reactant to the metal layer 103 is greater than an etching rate of the first reactant to the barrier layer 102, which can be achieved by adjusting a composition of the first reactant. Thus, the first planarization process the can stop on the barrier layer 102. However, because the etching rate of the first reactant to the metal layer 103 is quicker than the etching rate of the first reactant to the barrier layer 102, a surface of the metal layer 103 in the trench 104 will form a dishing 1030 after the first planarization process in order to expose the barrier layer 102 on the dielectric layer 101.

Next, referring to FIG. 1C, a second planarization process is applied to the barrier layer 102 and the metal layer 103 by using a second reactant so that the dishing 1030 is eliminated. After the second planarization process, a portion of the barrier layer 102 on the dielectric layer 101 and a portion of the metal layer 103 in the trench 104 are removed so as to expose a surface of the dielectric layer 101 outside the trench 104. An etching rate of the second reactant to the barrier layer 102 is greater than an etching rate of the second reactant to the metal layer 103. Because the etching rate of the second reactant to the metal layer 103 is slower than the etching rate of the first reactant to the barrier layer 102, the dishing 1030 can be removed so that a top surface of the metal layer 103 in the trench 104 is flush with the surface of the dielectric layer 101 outside the trench 104, there by forming a surface with good flatness. A top surface of the metal layer 103 is lower than a top surface of the dielectric layer 101 on two sides of the trench. A height difference of the top surface of the gate metal layer and the top surface of the dielectric layer is less than 50 angstroms. Thereafter, the gate structure can be cleaned and then be transferred to a subsequent process, for example, an inter-layer dielectric (ILD) process, can be applied the gate structure with the flatness surface.

As mentioned above, two planarization processes having different etching selectivity ratio are applied so that the surface with good flatness can be obtained. Thus, the quality of the semiconductor component based on the surface with good flatness can be improved. The first planarization process is a first chemical mechanical polishing (CMP) process, and the second planarization process is a second chemical mechanical polishing (CMP) process. The first reactant is a first chemical mechanical polishing slurry, and the second reactant is a second chemical mechanical polishing slurry. The first chemical mechanical polishing process and the second chemical mechanical polishing process can be performed on a single-pad chemical mechanical polishing apparatus. The first chemical mechanical polishing process and the second chemical mechanical polishing process can also be performed on a multi-pad chemical mechanical polishing apparatuses capable of supplying various chemical mechanical polishing slurries, for example, the first chemical mechanical polishing slurry and the second chemical mechanical polishing slurry. It is noted that the first chemical mechanical polishing slurry and the second chemical mechanical polishing slurry can further include an abrasive material, for example, a powder of silicon oxide ($SiO_2$), cerium dioxide ($CeO_2$) or aluminum oxide ($Al_2O_3$). In addition, each of the first chemical mechanical polishing slurry and the second chemical mechanical polishing slurry includes an oxidizer. In order to have a suitable etching selectivity ratio, a concentration of the oxidizer of the first chemical mechanical polishing slurry is less than a concentration of the oxidizer of the second chemical mechanical polishing slurry. The oxidizer can be, but not limited to, hydrogen peroxide. For example, a concentration of the hydrogen peroxide of the first chemical mechanical polishing slurry is in a range from 0% to 1%. A concentration of the hydrogen peroxide of the second chemical mechanical polishing slurry is greater than 1%. The concentration of the hydrogen peroxide of the second chemical mechanical polishing slurry can be, but not limited to, either 3% or 5%. Thus, an etching selectivity ratio of the first chemical mechanical polishing slurry to the gate metal layer and the gate barrier layer is more than 20, and an etching selectivity ratio of the second chemical mechanical polishing slurry to the gate metal layer and the gate barrier layer is more than 20.

Figure 2B:
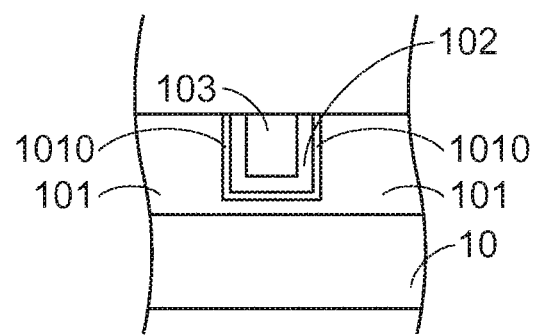

The gate dielectric layer 1010 is a high-K dielectric layer. The high-K dielectric layer can be either a single layer structure selected from a group consisting of a hafnium oxide ($HfO_2$) layer, a hafnium silicon oxynitride (HfSiON) layer and a hafnium silicon oxide (HfSiO) layer or a multilayer structure comprised of at least two of the hafnium oxide layer, the hafnium silicon oxynitride layer and the hafnium silicon oxide layer. The gate dielectric layer 1010 is formed below the barrier layer 102. Referring to FIG. 2A, if the gate dielectric layer 1010 is formed before forming the dummy poly-silicon gate, the gate dielectric layer 1010 can only be formed on a bottom of the trench 104. FIG. 2B, if the gate dielectric layer 1010 is formed after removing the dummy poly-silicon gate, the gate dielectric layer 1010 can be formed on the bottom of the trench 104 and on a sidewall of the trench 104. In other words, the high-K dielectric layer 1010 has a U-shaped cross-sectional configuration. The barrier layer 102 can be either a single layer structure selected from a group consisting of a titanium nitride (TiN) layer, a tantalum carbide (TaC) layer, a tungsten carbide (WC) layer, a titanium carbide (TiC) layer, a tantalum nitride (TaN) layer and a titanium aluminum nitride (TiAlN) layer or a multilayer structure comprised of at least two of the titanium nitride layer, the tantalum carbide layer, the tungsten carbide layer, the titanium carbide layer, the tantalum nitride layer and the titanium aluminum nitride layer. The barrier layer 102 can be configured for a work function metal layer, a strained layer, a work function tuning metal layer, a liner layer, or a sealant layer. The metal layer 103 can be either a single layer structure selected from a group consisting of a titanium nitride (TiN) layer, a tungsten (W) layer, an aluminum (Al) layer, a titanium (Ti) layer, a tantalum (Ta) layer, a tantalum nitride (TaN) layer, a cobalt (Co) layer, a copper (Cu) layer and a nickel (Ni) layer or a multilayer structure comprised of at least two of the titanium nitride layer, the tungsten layer, the aluminum layer, the titanium layer, the tantalum layer, the tantalum nitride layer, the cobalt layer, the copper layer and the nickel layer.

Additionally, in order to increase the productivity, before the portion of the gate metal layer is removed to expose a portion of the gate barrier layer by using the first reactant, a third planarization process can be applied to the metal layer 103 by using a third reactant. Thus, the gate metal layer can be thinned to a predetermined thickness before the first planarization process. The predetermined thickness is greater than 100 angstroms and closes to 100 angstroms. An etching rate of the third reactant to the metal layer 103 is greater than the etching rate of the first reactant to the metal layer 103. Thus, the metal layer 103 can be thinned to the predetermined thickness quickly, thereby reducing the time of planarization process.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A planarization method applied in a process of manufacturing a semiconductor component, comprising:
   providing a substrate;
   forming a dielectric layer above the substrate, the dielectric layer defining a trench therein;
   forming a barrier layer and a metal layer on the dielectric layer in sequence and filled in the trench;
   applying a first planarization process to the metal layer by using a first reactant so that a portion of the metal layer is removed to expose a portion of the barrier layer, an etching rate of the first reactant to the metal layer being greater than an etching rate of the first reactant to the barrier layer; and
   applying a second planarization process to the barrier layer and the metal layer by using a second reactant so that a portion of the barrier layer and a portion of the metal layer are removed to expose the dielectric layer, an etching rate of the second reactant to the barrier layer being greater than an etching rate of the second reactant to the metal layer;
   wherein the first planarization process is a first chemical mechanical polishing process, the second planarization process is a second chemical mechanical polishing process, the first reactant is a first chemical mechanical polishing slurry, the second reactant is a second chemical mechanical polishing slurry, each of the first chemical mechanical polishing slurry and the second chemical mechanical polishing slurry includes an oxidizer, and a concentration of the oxidizer of the first chemical mechanical polishing slurry is less than a concentration of the oxidizer of the second chemical mechanical polishing slurry.

2. The planarization method as claimed in claim 1, further comprising forming a gate dielectric layer below the dielectric layer.

3. The planarization method as claimed in claim 1, wherein the barrier layer is either a single layer structure selected from a group consisting of a titanium nitride (TiN) layer, a tantalum carbide (TaC) layer, a tungsten carbide (WC) layer, a titanium carbide (TiC) layer, a tantalum nitride (TaN) layer and a titanium aluminum nitride (TiAlN) layer or a multilayer structure comprised of at least two of the titanium nitride layer, the tantalum carbide layer, the tungsten carbide layer, the titanium carbide layer, the tantalum nitride layer and the titanium aluminum nitride layer.

4. The planarization method as claimed in claim 1, wherein the metal layer is either a single layer structure selected from a group consisting of a titanium nitride (TiN) layer, a tungsten (W) layer, an aluminum (Al) layer, a titanium (Ti) layer, a tantalum (Ta) layer, a tantalum nitride (TaN) layer, a cobalt (Co) layer, a copper (Cu) layer and a nickel (Ni) layer or a multilayer structure comprised of at least two of the titanium nitride layer, the tungsten layer, the aluminum layer, the titanium layer, the tantalum layer, the tantalum nitride layer, the cobalt layer, the copper layer and the nickel layer.

5. The planarization method as claimed in claim 1, wherein the first chemical mechanical polishing process and the second chemical mechanical polishing process are performed either on single-pad chemical mechanical polishing apparatus or on a multi-pad chemical mechanical polishing apparatus capable of supplying the first chemical mechanical polishing slurry and the second chemical mechanical polishing slurry, and each of the first chemical mechanical polishing slurry and the second chemical mechanical polishing slurry further comprises an abrasive material selected from a group consisting of silicon, cerium dioxide ($CeO_2$) and aluminum oxide ($Al_2O_3$).

6. The planarization method as claimed in claim 1, wherein the oxidizer is a hydrogen peroxide.

7. The planarization method as claimed in claim 6, wherein a concentration of the hydrogen peroxide of the first chemical mechanical polishing slurry is in a range from 0% to 1%, and a concentration of the hydrogen peroxide of the second chemical mechanical polishing slurry is greater than 1%.

8. The planarization method as claimed in claim 1, before forming the barrier layer, further comprising forming a gate dielectric layer in the trench.

9. The planarization method as claimed in claim 8, wherein the gate dielectric layer is a high-K dielectric layer, the barrier layer is a gate barrier layer, and the metal layer is a gate metal layer.

10. The planarization method as claimed in claim 9, wherein the high-K dielectric layer is either a single layer structure selected from a group consisting of a hafnium oxide ($HfO_2$) layer, a hafnium silicon oxynitride (HfSiON) layer and a hafnium silicon oxide (HfSiO) layer or a multilayer structure comprised of at least two of the hafnium oxide layer, the hafnium silicon oxynitride layer and the hafnium silicon oxide layer.

11. A planarization method applied in a process of manufacturing a semiconductor component, comprising:
    providing a substrate, a gate structure being formed on the substrate, the gate structure comprising a dielectric layer and a dummy poly-silicon gate disposed in the dielectric layer;
    removing the dummy poly-silicon gate to form a trench in the dielectric layer;
    forming a gate barrier layer on the dielectric layer and in the trench;
    forming a gate metal layer on the gate barrier layer and filled into the trench;
    applying a first planarization process to the gate metal layer by using a first reactant so that a portion of the gate metal layer is removed to expose a portion of the gate barrier layer, an etching rate of the first reactant to the gate metal layer being greater than an etching rate of the first reactant to the gate barrier layer; and
    applying a second planarization process to the gate barrier layer and the gate metal layer by using a second reactant so that a portion of the gate barrier layer and a portion of the gate metal layer are removed to expose the dielectric layer, an etching rate of the second reactant to the gate barrier layer being greater than an etching rate of the second reactant to the gate metal layer;

wherein the first planarization process is a first chemical mechanical polishing process, the second planarization process is a second chemical mechanical polishing process, the first reactant is a first chemical mechanical polishing slurry, and the second reactant is a second chemical mechanical polishing slurry, each of the first chemical mechanical polishing slurry and the second chemical mechanical polishing slurry includes an oxidizer, and a concentration of the oxidizer of the first chemical mechanical polishing slurry is less than a concentration of the oxidizer of the second chemical mechanical polishing slurry.

12. The planarization method as claimed in claim 11, further comprising forming a gate dielectric layer below the dielectric layer.

13. The planarization method as claimed in claim 11, wherein the gate barrier layer is either a single layer structure selected from a group consisting of a titanium nitride (TiN) layer, a tantalum carbide (TaC) layer, a tungsten carbide (WC) layer, a titanium carbide (TiC) layer, a tantalum nitride (TaN) layer and a titanium aluminum nitride (TiAlN) layer or a multilayer structure comprised of at least two of the titanium nitride layer, the tantalum carbide layer, the tungsten carbide layer, the titanium carbide layer, the tantalum nitride layer and the titanium aluminum nitride layer.

14. The planarization method as claimed in claim 11, wherein the gate metal layer is either a single layer structure selected from a group consisting of a titanium nitride (TiN) layer, a tungsten (W) layer, an aluminum (Al) layer, a titanium (Ti) layer, a tantalum (Ta) layer, a tantalum nitride (TaN) layer, a cobalt (Co) layer, a copper (Cu) layer and a nickel (Ni) layer or a multilayer structure comprised of at least two of the titanium nitride layer, the tungsten layer, the aluminum layer, the titanium layer, the tantalum layer, the tantalum nitride layer, the cobalt layer, the copper layer and the nickel layer.

15. The planarization method as claimed in claim 11, before forming the barrier layer, further comprising forming a gate dielectric layer in the trench.

16. The planarization method as claimed in claim 15, wherein the gate dielectric layer is a high-K dielectric layer, and the high-K dielectric layer is either a single layer structure selected from a group consisting of a hafnium oxide ($HfO_2$) layer, a hafnium silicon oxynitride (HfSiON) layer and a hafnium silicon oxide (HfSiO) layer or a multilayer structure comprised of at least two of the hafnium oxide layer, the hafnium silicon oxynitride layer and the hafnium silicon oxide layer.

17. The planarization method as claimed in claim 11, wherein before the first planarization process, further comprising applying a third planarization process to the gate metal layer by using a third reactant so that the gate metal layer is thinned to a predetermined thickness, an etching rate of the third reactant to the gate metal layer is greater than the etching rate of the first reactant to the gate metal layer.

18. The planarization method as claimed in claim 17, wherein the predetermined thickness is greater than 100 angstroms.

19. The planarization method as claimed in claim 11, wherein the first chemical mechanical polishing process and the second chemical mechanical polishing process are performed either on single-pad chemical mechanical polishing apparatus or on a multi-pad chemical mechanical polishing apparatus capable of supplying the first chemical mechanical polishing slurry and the second chemical mechanical polishing slurry, and each of the first chemical mechanical polishing slurry and the second chemical mechanical polishing slurry further comprises an abrasive powder material selected from a group consisting of silicon, cerium dioxide ($CeO_2$) and aluminum oxide ($Al_2O_3$).

20. The planarization method as claimed in claim 19, wherein an etching selectivity ratio of the first chemical mechanical polishing slurry to the gate metal layer and the gate barrier layer is more than 20, and an etching selectivity ratio of the second chemical mechanical polishing slurry to the gate metal layer and the gate barrier layer is more than 20.

21. The planarization method as claimed in claim 11, wherein the oxidizer is a hydrogen peroxide.

22. The planarization method as claimed in claim 21, wherein a concentration of the hydrogen peroxide of the first chemical mechanical polishing slurry is in a range from 0% to 1%, and a concentration of the hydrogen peroxide of the second chemical mechanical polishing slurry is greater than 1%.

* * * * *